US009941660B2

(12) United States Patent
Lin et al.

(10) Patent No.: US 9,941,660 B2
(45) Date of Patent: Apr. 10, 2018

(54) WAVELENGTH VERSATILE VECSEL RAMAN LASER

(71) Applicant: Macquarie University, North Ryde (AU)

(72) Inventors: Jipeng Lin, North Ryde (AU); Helen M. Pask, North Ryde (AU); David James Spence, North Ryde (AU); Craig J. Hamilton, Glasgow (GB); Graeme P. A. Malcolm, Glasgow (GB)

(73) Assignee: Macquarie University, North Ryde (AU)

( * ) Notice: Subject to any disclaimer, the term of this patent is extended or adjusted under 35 U.S.C. 154(b) by 0 days.

(21) Appl. No.: 14/355,734

(22) PCT Filed: Nov. 9, 2012

(86) PCT No.: PCT/AU2012/001389
§ 371 (c)(1),
(2) Date: May 1, 2014

(87) PCT Pub. No.: WO2013/067599
PCT Pub. Date: May 16, 2013

(65) Prior Publication Data
US 2014/0269787 A1 Sep. 18, 2014

(30) Foreign Application Priority Data
Nov. 9, 2011 (AU) .................................. 2011904665

(51) Int. Cl.
*H01S 3/108* (2006.01)
*H01S 3/30* (2006.01)
(Continued)

(52) U.S. Cl.
CPC ............ *H01S 5/0604* (2013.01); *H01S 3/109* (2013.01); *H01S 3/1086* (2013.01); *H01S 3/30* (2013.01);
(Continued)

(58) Field of Classification Search
CPC .......... H01S 3/30; H01S 3/1086; H01S 3/109; H01S 5/0604; H01S 5/141; H01S 5/183; H01S 5/142; H01S 5/041; H01S 3/082; H01S 3/08027
See application file for complete search history.

(56) References Cited

U.S. PATENT DOCUMENTS 4,878,224 A * 10/1989 Kuder ..................... H01S 3/168
372/20
5,673,281 A 9/1997 Byer
(Continued)

FOREIGN PATENT DOCUMENTS

| WO | WO 2006/032105 A1 | 3/2006 |
| WO | WO 2007/118269 A1 | 10/2007 |
| WO | WO 2011/075780 A1 | 6/2011 |

OTHER PUBLICATIONS

Calvez et al. "Semiconductor disk lasers for the generation of visible and ultraviolet radiation", Jan. 13, 2009.*
(Continued)

*Primary Examiner* — Marcia Golub-Miller
(74) *Attorney, Agent, or Firm* — Wolf, Greenfield & Sacks, P.C.

(57) ABSTRACT

A tunable lasing device including a vertical external cavity surface emitting laser, adapted to generate a fundamental laser beam in response to pumping from a pump source, said fundamental laser beam having a fundamental wavelength and a fundamental linewidth; a fundamental resonator cavity adapted to resonate the fundamental beam therein; a first optical element located within the fundamental resonator cavity for control of the fundamental linewidth of the
(Continued)

Figure 1 fundamental beam; a Raman resonator located at least partially in said fundamental resonator adapted to receive the fundamental beam and comprising therein, a solid state Raman active medium located therein for generating at least a first Stokes beam from the fundamental beam wherein said Raman resonator cavity is adapted to resonate said Stokes beam therein and further adapted to emit an output beam; and further comprising a nonlinear medium located within the Raman resonator cavity for nonlinear frequency conversion of at least one of the beams present in the fundamental or the Raman resonator cavity; said tunable lasing device further comprising an output coupler adapted to emit an output beam, said output beam comprising at least a portion of said frequency converted beam being derived from at least one of the resonating beams in said fundamental or said Raman resonator cavities.

16 Claims, 9 Drawing Sheets

(51) Int. Cl.
| | | |
|---|---|---|
| *H01S 5/06* | (2006.01) | |
| *H01S 5/183* | (2006.01) | |
| *H01S 3/109* | (2006.01) | |
| *H01S 5/14* | (2006.01) | |
| *H01S 3/08* | (2006.01) | |
| *H01S 3/082* | (2006.01) | |
| *H01S 5/04* | (2006.01) | |

(52) U.S. Cl.
CPC .............. *H01S 5/141* (2013.01); *H01S 5/183* (2013.01); *H01S 3/082* (2013.01); *H01S 3/08027* (2013.01); *H01S 5/041* (2013.01); *H01S 5/142* (2013.01)

(56) References Cited

U.S. PATENT DOCUMENTS

| | | | |
|---|---|---|---|
| 8,345,717 | B2* | 1/2013 | Dekker et al. .................... 372/3 |
| 2006/0120414 | A1 | 6/2006 | Hori |
| 2008/0259969 | A1* | 10/2008 | Piper et al. ........................ 372/3 |
| 2012/0113994 | A1* | 5/2012 | Georges et al. ................... 372/3 |
| 2015/0063830 | A1* | 3/2015 | Petersen et al. .............. 398/201 |

OTHER PUBLICATIONS

M. Kuznetov, "Vecsel Semiconductor Lasers: A Path to High-Power, Quality Beam and UV to IR Wavelength by Design", Semiconductor Disk Lasers: Physics and Technology, Wiley Online Library, Chap. 1 (2010), 73 pages.

S.H. Park et al., "Room-temperature GaN vertical-cavity surface-emitting laser operation in an extended cavity scheme", Appl. Phys. Lett., vol. 83, No. 11, Sep. 15, 2003, pp. 2121-2123.

N. Schulz et al., "An improved active region concept for highly efficient GaSb-based optically in-well pumped vertical-external-cavity surface-emitting lasers", Appl. Phys. Lett., vol. 93, 181113 (2008).

J. Chilla et al., "Recent Advantages in Optically Pumped Semiconductor Lasers", Proc. SPIE, vol. 6451, 645109 (2007), pp. 1-10.

M. Fallahi et al., "5-W Yellow Laser by Intracavity Frequency Doubling of High-Power Vertical-External-Cavity Surface-Emitting Laser", IEEE Photonics Technology Letters, vol. 20, No. 20, Oct. 15, 2008, pp. 1700-1702.

T. Baer, "Large-amplitude fluctuations due to longitudinal mode coupling in diode-pumped intracavity-doubled Nd:YAG lasers", J. Opt. Soc. Am. B, vol. 3, No. 9, Sep. 1986, pp. 1175-1180.

D.J.M. Stothard et al., "Stable, continuous-wave, intracavity, optical parametric oscillator pumped by a semiconductor disk laser (VECSEL)", Optics Express, vol. 17, No. 13, 10648, Jun. 22, 2009, 11 pages.

Hoffmann et al., "Generation of Terahertz radiation with two color semiconductor lasers", Laser & Photon. Rev., 1, No. 1, (2007), pp. 44-56.

D.C. Parrotta et al., "Continuous-wave Raman laser pumped within a semiconductor disk laser cavity", Optics Letters, vol. 36, No. 7, Apr. 1, 2011, pp. 1083-1085.

A.J. Lee et al., "A wavelength-versatile, continuous-wave, self-Raman solid-state laser operating in the visible", Optics Express, vol. 18, No. 19, Sep. 13, 2010, pp. 20013-20018.

A.J. Lee et al., "High efficiency, multi-Watt CW yellow emission from an intracavity-doubled self-Raman laser using Nd:GdVO$_4$", Optics Express, vol. 16, No. 26, Dec. 22, 2008, pp. 21958-21963.

T.D. Raymond et al., "Intracavity frequency doubling of a diode-pumped external-cavity surface-emitting semiconductor laser", Optics Letters, vol. 24, No. 16, Aug. 15, 1999, pp. 1127-1129.

A.J. Lee et al., "Near-infrared and orange-red emission from a continuous-wave, second-Stokes self-Raman Nd:GdVO$_4$laser", Optics Letters, vol. 35, No. 18, Sep. 15, 2010, pp. 3000-3002.

Lee, A.J. et al., "A continuous-wave laser with wavelength-selectable output spanning green-yellow-red", Lasers and Electro-Optics Europe (CLEO EUROPE/EQEC), 2011 Conference on and 12th European Quantum Electronic Conference, IEEE, May 22, 2011, p. 1.

Extended Search Report dated Oct. 7, 2015 from European Patent Application No. 12846955.8.

Notice of Reasons for Rejection dated Jun. 21, 2016 from corresponding Japanese Patent Application No. 2014-540277.

* cited by examiner

WAVELENGTH VERSATILE VECSEL RAMAN LASER

FIELD OF THE INVENTION

The present invention relates to methods and apparatus for enhancing the spectral coverage of optically pumped semiconductor lasers. The present invention further relates to tunable Raman laser apparatus and methods of operation of tunable Raman laser systems.

BACKGROUND

Any discussion of the background art throughout the specification should in no way be considered as an admission that such art is prior art, nor that such background art is widely known or forms part of common general knowledge in the field.

Optically-pumped semiconductor vertical-external-cavity surface-emitting lasers (VECSELs) have evolved rapidly during the past decade. An extensive discussion is contained in M. Kuznetov, Semiconductor Disk Lasers: Physics and Technology. Wiley Online Library. Chap. 1 (2010). VECSELs are a very versatile type of laser, because a wide range of semiconductor materials can deliver a selection of emission wavelengths and tenability, and because the open cavity design enables easy integration of intracavity components and nonlinear processes. From a single VECSEL, the direct emission has ranged from violet at 390 nm [2] to mid-infrared [3], and output powers up to 40 W output power have been reported to date [4].

Intracavity second harmonic generation (SHG) is well established as a means of substantially expanding the spectral coverage of VECSELs, and the yellow region is one that has been particularly targeted [5]. Intracavity-doubled VECSELs also benefit from the short carrier life time in semiconductors (typically a few ns) and the lack of spatial hole burning in the periodic gain structure, and therefore their output has low amplitude noise. This is in contrast to the so-called "green problem" [6], in which longitudinal-mode competition often causes strong intensity noise in intracavity doubled conventional solid-state lasers. Other intracavity second-order nonlinear processes that have been reported for VECSELs are optical parametric oscillation [7] and difference frequency generation [8].

Recently, Parrotta et al. has demonstrated a VECSEL-pumped intracavity continuous-wave (cw) Raman laser [9], in a new approach to combine the tunability from VECSELs with wavelength shifting from stimulated Raman scattering (SRS). They pumped a KGW crystal within a VECSEL cavity and shifted the fundamental emission around 1.06 µm to 1.14 µm with a tunable range from 1133-1157 nm.

SUMMARY OF THE INVENTION

It is an object of the present invention to provide an improved form of optically pumped semiconductor laser. It is another object of the invention to provide an improved form of tunable laser system.

It is a further object of the present invention to overcome or ameliorate at least one of the disadvantages of the prior art, or to provide a useful alternative.

In accordance with a first aspect of the present invention, there is provided a tunable lasing device. The tunable lasing device may comprise a vertical external cavity surface emitting laser, adapted to generate a fundamental laser beam in response to pumping from a pump source, the fundamental laser beam having a tunable fundamental wavelength and a fundamental linewidth. The tunable lasing device may further comprise a fundamental resonator cavity adapted to resonate the fundamental beam therein. The tunable lasing device may further comprise a first optical element located within the fundamental resonator cavity for control of the fundamental linewidth of the fundamental beam. The first optical element may additionally be adapted for tuning the wavelength of the fundamental beam. The fundamental resonator cavity may comprise said external cavity of said vertical external cavity surface emitting laser. The tunable lasing device may further comprise a Raman resonator cavity located at least partially in the fundamental resonator cavity and coupled therewith. The Raman resonator may be adapted to receive the fundamental beam. The Raman resonator may comprise a solid state Raman active medium located therein for generating at least a first Stokes beam from the fundamental beam. The Raman resonator cavity may be adapted to resonate the Stokes beam therein. The Raman resonator may be further adapted to emit an output beam. The Raman resonator may further comprise a nonlinear medium located therein for nonlinear frequency conversion of at least one of the beams present in said Raman resonator cavity thereby generating a frequency converted beam. The tunable lasing device may further comprise an output coupler adapted to emit an output beam. The output beam may be at least a portion of the frequency converted beam derived from at least one of the resonating beams in either the fundamental or Raman resonator cavities.

According to an arrangement of the first aspect, there is provided a tunable lasing device comprising: a vertical external cavity surface emitting laser, adapted to generate a fundamental laser beam in response to pumping from a pump source, the fundamental laser beam having a tunable fundamental wavelength and a fundamental linewidth; a; a fundamental resonator cavity adapted to resonate the fundamental beam therein; a first optical element located within the fundamental resonator cavity for control of the fundamental linewidth of the fundamental beam; a Raman resonator cavity located at least partially in the fundamental resonator cavity and coupled therewith, the Raman resonator adapted to receive the fundamental beam and comprising therein: a solid state Raman active medium for generating at least a first Stokes beam from the fundamental beam wherein said Raman resonator cavity is adapted to resonate said Stokes beam therein and further adapted to emit an output beam; and a nonlinear medium located therein for nonlinear frequency conversion of at least one of the beams present in said Raman resonator cavity thereby generating a frequency converted beam; said tunable lasing device further comprising an output coupler adapted to emit an output beam, the output beam comprising at least a portion of said frequency converted beam derived from at least one of the resonating beams in the fundamental or the Raman resonator cavities.

The solid state Raman active medium may be located within both the Raman resonator cavity and the fundamental resonator cavity. The fundamental beam may be a continuous wave (cw) beam. In alternate arrangements the fundamental beam may be a pulsed beam. In a particular arrangement the fundamental cavity may comprise a Q-switch element for generating the pulsed fundamental beam. The Q-switch may be located in the fundamental resonator cavity. In particular arrangements, the Q-switch element may be either an active Q-switch, a passive Q-switch or alternative element for generating a Q-switched fundamental beam as would be a appreciated by the skilled addressee.

In alternate arrangements the fundamental beam may be a modelocked beam and the fundamental resonator cavity may comprise a mode-locking element for generating the modelocked fundamental beam pulses. In particular arrangements the modelocked beam may be generated by one or more elements in the fundamental resonator cavity to form a Kerr-lens modelocked fundamental beam. Alternatively, the fundamental resonator may comprise a saturable absorber to generate the mode-locked fundamental beam pulses. Therefore, the Stokes beam and the frequency converted beam may also be cw or pulsed beams depending on whether the fundamental beam is a cw or pulsed beam respectively. The fundamental resonator cavity may be a high finesse resonator cavity at the wavelength of the fundamental beam. The fundamental resonator cavity may be a high finesse resonator cavity at the wavelengths of the fundamental beam. The fundamental resonator cavity my simultaneously be a low finesse resonator cavity at the wavelength(s) of the frequency converted beam. The Raman resonator may be a high finesse resonator cavity at the wavelength(s) of the Raman-shifted (Stokes) beam(s) (e.g. the first Stokes beam or higher order Stokes beams generated by cascaded Raman shifting of previously Raman shifted beam(s) in the resonator cavity e.g. having for example second- or third-Stokes wavelengths). The Raman resonator cavity may simultaneously be a low finesse resonator cavity at the wavelength(s) of the frequency converted beam. Raman resonator at least partially overlaps the fundamental resonator—the portion of the Raman resonator which contains the Raman material must be within the fundamental resonator R res can extend beyond.

The Raman resonator cavity may be coupled to the fundamental resonator cavity. The Raman resonator cavity may be at least partially contained within the fundamental resonator. For example, the Raman resonator cavity may be wholly located within the fundamental resonator. Alternatively, the Raman resonator cavity may be only partially located within the fundamental resonator cavity. For example the Raman resonator cavity may partially located external to the fundamental resonator cavity. For instance, the fundamental cavity may comprise a mirror (reflector) located therein which comprises a first end mirror for the Raman resonator cavity—the first end mirror typically will be highly transmissive at the wavelengths of the tunable fundamental beam and simultaneously highly reflective at the wavelengths of the Raman shifted beam(s)—and a further mirror (reflector) may be located external to the fundamental resonator which comprises a second end mirror for the Raman resonator cavity. In this arrangement, the Raman resonator typically will comprise therein a mirror (reflector) which comprises an end mirror of the fundamental resonator cavity. The end mirror of the fundamental resonator cavity located within the Raman resonator will typically be highly transmissive at the wavelength(s) of the Raman shifted beam(s) and simultaneously highly reflective at the wavelengths of the fundamental beam.

The first optical element for control of the fundamental linewidth of the fundamental beam may, for example, be one or more birefringent filters and/or one or more intracavity etalons located in the fundamental resonator cavity.

The vertical external cavity surface emitting laser (VECSEL) may be a semiconductor device capable of generating a laser emission when optically pumped from an external pump source. The laser emission generated by the optically pumped semiconductor device may comprise the fundamental laser beam. The laser emission generated by the optically pumped semiconductor device may be tunable thereby providing a tunable fundamental laser beam. The tunable fundamental beam may resonate (i.e. circulate) within the fundamental resonator cavity.

The tunable lasing device may be adapted to generate a tunable output beam having a wavelength in the visible optical spectrum. The wavelength of the output beam may be between about 470 nm and about 630 nm. The tunable lasing device may be adapted to generate a tunable output beam having a wavelength in either the blue, green or yellow regions of the visible optical spectrum. The output wavelength of the tunable lasing device may be selected from the ranges including, for example, between about 440 nm to 500 nm, or between about 500 nm to 550 nm, or between about 550 nm to 590 nm. In an alternate arrangement, the output wavelength of the tunable lasing device may be continuously tunable between about 470 nm and about 520 nm. In alternate arrangements the wavelength of the output beam may be selected to lie within the orange or red regions of the visible spectrum. That is, the output wavelength of the tunable lasing device may alternately be selected from the range including, for example, between about between about 590 nm to about 650 nm.

In a particular arrangement, the tunable lasing device may be adapted to generate an output beam having a wavelength selectable from the group comprising: a wavelength in the blue region of the spectrum; a wavelength in the green region of the spectrum; and a wavelength in the yellow region of the spectrum. For instance, in a first mode of operation, the lasing device is configured such that the wavelength of the output beam lies within the blue region of the visible optical spectrum; in a second mode of operation, the lasing device is configured such that the wavelength of the output beam lies within the green region of the visible optical spectrum; and in a third mode of operation the lasing device is configured such that the wavelength of the output beam lies within the yellow region of the visible optical spectrum. In each mode of operation, the wavelength of the output beam may be further tunable about a discrete range of wavelengths in each of the blue, green or yellow regions of the visible optical spectrum with respect to the selected mode of operation. In this manner, the lasing device disclosed herein may act as a replacement for three independent laser systems wherein each of those independent systems are adapted for output of a single wavelength only i.e. either a blue, green or yellow wavelength. Merely by tuning of the lasing device of the present application, the lasing device may select a desirable output wavelength for a particular task i.e. either a blue, green or yellow wavelength. Tuning of the laser device to select the desired wavelength of the output beam may comprise one or more of: tuning of the wavelength of the fundamental beam generated by the vertical external cavity surface emitting laser; or tuning the Raman-active medium to select a desired Raman-shift of the fundamental beam (i.e. in arrangements where multiple Raman transitions are available in the Raman-active medium e.g. using KGW as the Raman active medium having selectable characteristic Raman shifts of either 768 $cm^{-1}$ or 901 $cm^{-1}$); or tuning of the nonlinear medium for selective frequency conversion of one or more of the wavelengths in the Raman resonator cavity (e.g. via SHG, SFG or DFG) thereby to obtain a frequency converted beam having the desired wavelength and outputting at least a portion of the frequency converted beam as an output beam having the desired wavelength.

In a further particular arrangement, the tunable lasing device may be adapted to generate an output beam having a wavelength selectable from the group comprising: a wavelength in the green region of the spectrum; a wavelength in the yellow region of the spectrum; and a wavelength in the red region of the spectrum.

In a further particular arrangement, the tunable lasing device may be adapted to generate an output beam having a wavelength selectable from the group comprising: a wavelength in the blue region of the spectrum; and a wavelength in the green region of the spectrum.

In a further particular arrangement, the tunable lasing device may be adapted to generate an output beam having a wavelength selectable from the group comprising: a wavelength in the green region of the spectrum; a wavelength in the yellow region of the spectrum.

In an alternate arrangement, the tunable lasing device may be adapted to generate a tunable output beam having a wavelength in either the green, yellow or orange/red regions of the visible optical spectrum. The output wavelength of the tunable lasing device may be selected from the ranges including, for example, between about 510 nm to 550 nm, or between about 555 nm to 575 nm, or between about 575 nm to 650 nm. In an alternate arrangement, the output wavelength of the tunable lasing device may be continuously tunable between about 520 nm and about 560 nm.

In any of the aspects and arrangements of the tunable lasing device disclosed herein, the output wavelength of the tunable lasing device may be selected by tuning either: the wavelength of the fundamental beam; or tuning of the Raman-active medium to select a desired Raman-shift of the fundamental beam; or tuning (e.g. either temperature or angle tuning) of the nonlinear medium or any combination of two or more of such tuning methods.

Preferably the device further includes a nonlinear optical crystal within the resonator cavity for producing a frequency converted beam derived from either: the fundamental beam, the Raman beam, or both the fundamental and Raman beams. The frequency converted beam may be obtained by second harmonic generation and/or sum frequency or difference frequency generation of the fundamental beam and/or the Stokes beam within the cavity and outputting thereof. At least one mirror of the resonator cavity may be adapted to output the frequency converted beam.

Preferably, the first filter can comprise a birefringent element, the Raman resonator can comprise a Potassium Gadolinium Tungstate (KGW) crystal, and the nonlinear crystal can be a Lithium Triborate Crystal.

In accordance with a further aspect of the present invention, there is provided a method of extending the frequency of an optically pumped intra cavity tunable laser, the method including the steps of: generating intra cavity stimulated Raman scattering to generate a first Stokes wavelength; and converting the Stokes wavelength by intra cavity sum frequency generation (SFG), difference frequency (DFG) or second harmonic generation (SHG) to a second wavelength range.

Preferably, the tunable laser can be optically pumped by a VECSEL laser. The method can also include the steps of: generating a second Stokes wavelength; and converting the second Stokes wavelength by intra cavity nonlinear frequency generation techniques (including, for example, sum frequency generation, second harmonic generation or third harmonic generation) to thereby generate at least a third wavelength range In accordance with a further aspect of the present invention, there is provided an optically pumped semiconductor VECSEL pumped, intra cavity KGW Raman tunable laser with intracavity nonlinear mixing. The intra cavity nonlinear mixing preferably can include outputting into two separate tunable emission bands. The tunable emission bands may comprise a first band generated by sum frequency generation and a second band may be generated by second harmonic generation. The tuning may be through temperature tuning of an intra cavity LBO crystal.

In accordance with a further aspect, there is provided a laser system comprising a vertical-external-cavity surface-emitting laser device adapted for generating a tunable laser beam tunable within one or more frequency ranges. The laser system may further comprise a Raman active medium and a nonlinear medium adapted for selectably generating one or more frequency converted beams derived from said fundamental laser beam thereby to permit the laser system to output laser wavelengths tunable within a plurality of discrete frequency ranges.

In an arrangement of any one of the above aspects, the Raman resonator cavity may have a high finesse at the optical wavelengths of the Raman beam and, simultaneously, a low finesse at the optical wavelength of the frequency converted beam. The finesse of the Raman resonator cavity at the wavelength of the Raman beam may be greater than 100. In other arrangements, the finesse of the Raman resonator cavity at the wavelength of the Raman beam may be greater than 500, or greater than 1000, greater than 2000, greater than 3000, greater than 4000, greater than 5000, greater than 6000, greater than 7000, greater than 8000, greater than 9000, greater than 10000, greater than 15000, greater than 20000, greater than 25000, greater than 30000, greater than 35000, greater than 40000, greater than 45000. The finesse of the Raman resonator cavity at the wavelength of the Raman beam may be in the range 100 to 50000, 100 to 45000, 100 to 40000, 100 to 35000, 100 to 30000, 100 to 25000, 100 to 20000, 100 to 15000, 100 to 10000, 100 to 9000, 100 to 8000, 100 to 7000, 100 to 6000, 100 to 5000, 100 to 4000, 100 to 3000, 100 to 2000, 100 to 1000, or 100 to 500, and may be approximately 100, 150, 200, 250, 300, 350, 400, 450, 500, 550, 600, 650, 700, 750, 800, 850, 900, 950, 1000, 1100, 1200, 1300, 1400, 1500, 1600, 1700, 1800, 1900, 2000, 2250, 2500, 2750, 3000, 3250, 3500, 3750, 4000, 4250, 4500, 4750, 5000, 6000, 7000, 80000, 9000, 10000, 11000, 12000, 13000, 14000, 15000, 16000, 17000, 18000, 19000, 20000, 25000, 30000, 35000, 40000, 45000, 50000. In an arrangement of any one of the above aspects, the Raman resonator cavity has a high Q at the wavelengths of the optical wavelengths of the Raman beam. The Raman resonator cavity may simultaneously have a low finesse at the optical wavelength of the frequency converted beam. The Raman resonator cavity may have both a high finesse and a high Q at the optical wavelengths of the optical wavelengths of the Raman beam. The Raman resonator cavity may have both a low finesse and a low Q at the optical wavelength of the frequency converted beam. In an arrangement of any one of the above aspects, the Raman resonator cavity may have a finesse at the wavelength of the frequency converted beam in the range of approximately 0 to 5. In a further arrangement, the Raman resonator cavity finesse at the wavelength of the frequency converted beam may be in the range of approximately 0 to 4.5, 0 to 4, 0 to 3.5, 0 to 3, 0 to 2.5, 0 to 2.4, 0 to 2.3, 0 to 2.2, 0 to 2.1, 0 to 2.0, 0 to 1.9, 0 to 1.8, 0 to 1.7, 0 to 1.6, 0 to 1.5, 0 to 1.4, 0 to 1.3, 0 to 1.2, 0 to 1.1, 0 to 1.0, 0 to 0.9, 0 to 0.8, 0 to 0.7, 0 to 0.6, 0 to 0.5, 0 to 0.4, 0 to 0.3, 0 to 0.2, 0 to 0.1, 0.5 to 5, 0 to 4.5, 0 to 4, 0.5 to 3, 0.5 to 3.5, 0.5 to 2, 0.5 to 1.5, 0.5 to 1.0, 1 to 4, 0 to 3, 1 to 2.5, 1 to 2, and the resonator finesse at the wavelength of the frequency converted beam may be approximately 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, 3.0, 3.5, 4.0, 4.5 or 5.

In an arrangement of any one of the above aspects, the Raman resonator cavity may have a roundtrip resonator loss, $L_\lambda$, at the wavelength of the Raman beam in the range of 0% to 5%. As discussed below, the round-trip resonator loss, $L_\lambda$, comprises all intracavity optical losses experienced by a laser beam resonating in the resonator cavity at a particular wavelength, i.e. the round-trip resonator loss, $L_\lambda$, comprises loss components from the mirror reflectivities of the cavity mirrors as well as additional loss components due to elements within the resonator cavity including for example, scattering/reflection losses from the elements of the resonator cavity. That is, the round-trip resonator loss, $L_\lambda$, comprises all losses experienced by a resonating beam in the cavity as it circulates through the resonator cavity and the elements contained therein. In further arrangements, the roundtrip resonator loss at wavelength of the Raman beam may be in the range of 0% to 4.5%, 0% to 4%, 0% to 3.5%, 0% to 3%, 0% to 2.5%, 0% to 2%, 0% to 1.9%, 0% to 1.8%, 0% to 1.7%, 0% to 1.6%, 0% to 1.5%, 0% to 1.4%, 0% to 1.3%, 0% to 1.2%, 0% to 1.1%, 0% to 1.0%, 0% to 0.9%, 0% to 0.8%, 0% to 0.7%, 0% to 0.6%, 0% to 0.5%, 0% to 0.3%, 0% to 0.2%, or 0% to 0.1%. In an arrangement of any one of the above aspects, the roundtrip resonator loss at the wavelength of the Raman beam may be approximately 0%, 0.1%, 0.2%, 0.3%, 0.4%, 0.5%, 0.65%, 0.7%, 0.8%, 0.9%, 1.0%, 1.1%, 1.2%, 1.3%, 1.4%, 1.5%, 1.6%, 1.7%, 1.8%, 1.9%, 2.0%, 2.5%, 3.0%, 3.5%, 4.0%, 4.5%%, or 5%.

BRIEF DESCRIPTION OF THE DRAWINGS

Preferred embodiments of the invention will now be described, by way of example only, with reference to the accompanying drawings in which.

DETAILED DESCRIPTION

Figure 1:
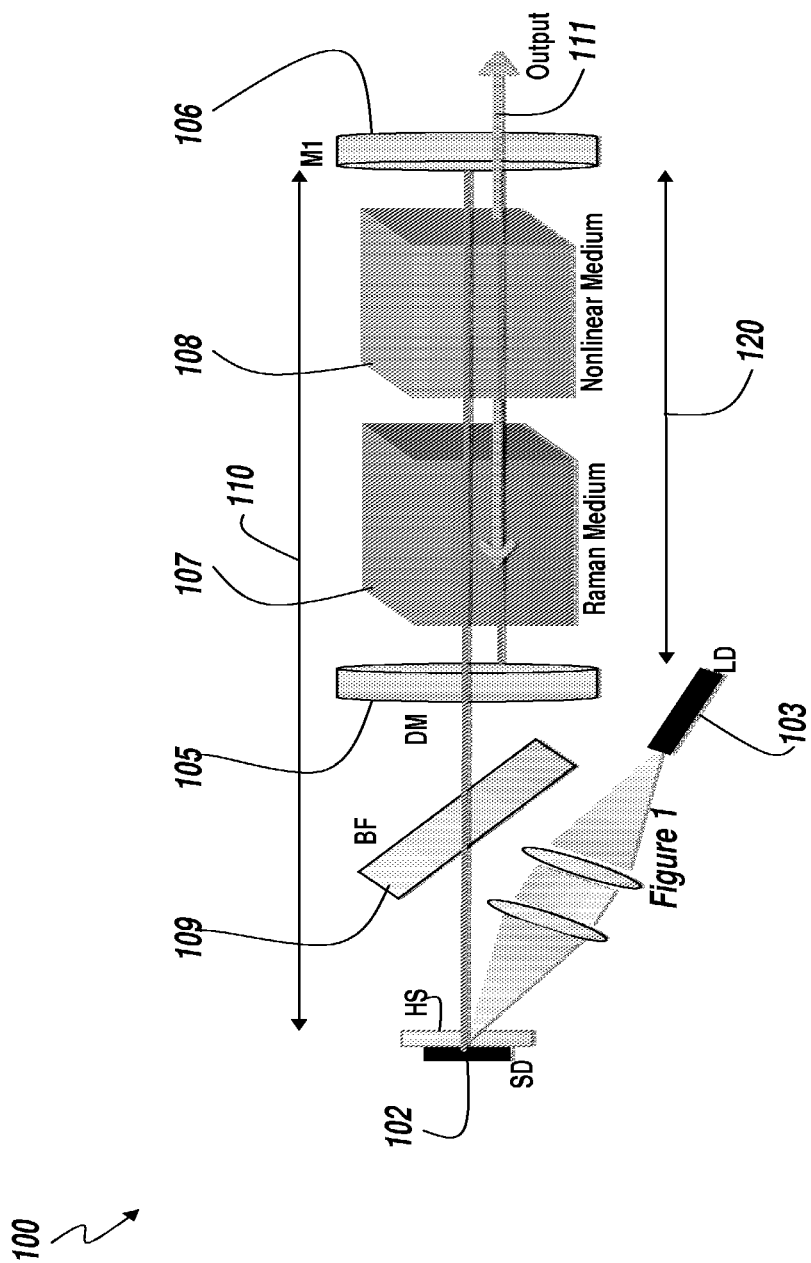
FIG. 1 illustrates schematically an arrangement of a VECSEL pumped CW Raman laser.

In particular arrangements if the laser system(s) disclosed herein there is provided a continuous-wave (cw) VECSEL Raman laser with and output beam having a wavelength tunable in the lime-yellow-orange region of the visible optical spectral. In alternate arrangements the laser system(s) disclosed herein may also provide a pulsed VECSEL Raman laser system.

In a laser system according to the arrangements of the present invention, there may potentially be a plurality of different wavelengths of laser light resonating in the resonator cavity or cavities thereof. This may be achieved by selecting the reflectivity of the reflectors which define the cavity such that the resonator cavity is a high Q cavity (i.e. high optical quality factor) for all wavelengths that are required to resonate therein and not a high Q cavity for wavelengths that are outputted from the resonator cavity. Equivalently, the cavity is a high finesse cavity for all wavelengths that are required to resonate therein and not a low finesse cavity for wavelengths that are outputted from the resonator cavity. There may be one or more of a fundamental wavelength, a first Stokes wavelength and a second Stokes wavelength. Further, in cases in which the Raman active medium has two or more Raman shifts, there may be a first and a second Stokes wavelengths from each of the two or more Raman shifted beams generated by the Raman active medium. The laser cavity of the invention may also have a non-linear medium capable of frequency doubling or sum frequency generation or difference frequency generation. Thus each of the above wavelengths may be frequency doubled, or any two may be frequency summed or frequency differenced, depending on the tuning of the non-linear medium. Therefore the presently disclosed laser system(s) may provide means to selectively output a wide variety of different wavelengths from the cavity and the output wavelength of the disclosed laser system(s) may be tunable over a wide band of possible output wavelengths.

The pump beam may be a beam from a diode laser or from some other pump source. The pumping may be end pumping or side pumping. The power of the output laser beam from the laser system may be dependent on the frequency of the pump laser beam, and the system may have means (such as a frequency controller) for altering the frequency of the pump laser beam in order to alter the power of the output laser beam.

It will be understood by one skilled in the art that the frequency and wavelength of a laser beam are connected by the equation:

Speed of light=wavelength*frequency.

As a consequence, when reference is made to frequency shifting, frequency converting, different frequencies, and similar terms, these are interchangeable with the corresponding terms wavelength shifting, wavelength converting, different wavelengths, and the like.

In constructing a laser according to the present invention, it is crucial that components of the laser are correctly positioned in order to achieve acceptable conversion efficiency to output laser power. The laser according to the present invention may be a solid state laser.

Materials: Typical materials used for the Raman-active medium and the non-linear medium are well known in the art. Examples of suitable solid state Raman-active media include KGW (potassium gadolinium tungstate), KYW (potassium yttrium tungstates), barium nitrate, lithium iodate, barium tungstate, strontium tungstate, lead tungstate, calcium tungstate, other tungstates and molybdates, diamond, gadolinium and yttrium, lithium niobate and other crystalline materials which are Raman-active. Each of the Raman-active media produces at least one characteristic Raman shift (to generate at least one characteristic Stokes wavelength from an input fundamental beam having a fundamental wavelength). A nonlinear material may also be provided for frequency conversion of either the fundamental beam or the Raman beam or both (e.g. sum-frequency mixing). Suitable non-linear media may for example be lithium borate (LBO), barium borate (BBO), BiBO or KTP. Tuning the nonlinear medium (for instance either through angle tuning or temperature tuning) may allow an operator to select one of the available possible output wavelengths as required.

Table 1 shows the Raman shifts for a range of Raman-active media, and Table 2 shows the Raman shifts and corresponding Stokes wavelengths for several Raman-active media.

TABLE 1

Raman shifts for selected Raman-active media Raman-active

| Crystal | Raman shift ($cm^{-1}$) |
|---|---|
| Diamond | 1342 |
| $CaCO_3$ | 1085 |
| $NaNO_3$ | 1066 |
| $Ba(NO_3)_2$ | 1046 |
| $YVO_4$ | 890 |
| $GdVO_4$ | 882 |
| KDP | 915 |
| $NaBrO_3$ | 795 |
| $LiIO_3$ | 822 and 770 |
| $BaWO_4$ | 926 |
| $PbWO_4$ | 901 |
| $CaWO_4$ | 908 |
| $ZnWO_4$ | 907 |
| $CdWO_4$ | 890 |
| $KY(WO_4)_2$ (KYW) | 765 and 905 |
| $KGd(WO_4)_2$ (KGW) | 768 and 901 |
| $NaY(WO_4)_2$ | 914 |
| $NaBi(WO_4)_2$ | 910 |
| $NaBi(MoO_4)_2$ | 877 |
| KTA | 234 |

TABLE 2

Raman shifts and corresponding Stokes wavelengths for selected Raman-active media pumped by fundamental beam centred at 1064 nm

| Crystal | Raman shift ($cm^{-1}$) | $1^{st}$ Stokes (nm) | $2^{nd}$ Stokes (nm) | $3^{rd}$ Stokes (nm) |
|---|---|---|---|---|
| Diamond | 1342 | 1240 | 1487 | 1856 |
| KGW | 768 | 1158 | 1272 | 1410 |
| KGW | 901 | 1176 | 1320 | 1500 |
| $PbWO_4$ | 911 | 1177 | 1316 | 1494 |
| $Ba(NO_3)_2$ | 1048 | 1198 | 1369 | 1599 |
| $LiIO_3$ | 745 | 1156 | 1264 | 1396 |

Each non-linear medium may be configured to select which wavelength will be converted by frequency doubling, sum frequency generation or difference frequency generation.

Examples of materials used for frequency doubling or sum frequency generation include crystalline LBO, LTBO, BBO, KTP, RTA, RTP, KTA, ADP, KD*P, KDP, CLBO, $LiNbO_3$ or periodically poled materials such as lithium niobate, KTP, KTA, RTA or other suitable materials. Periodically poled materials may generate frequency doubled or summed frequency outputs through quasi-phase matching. Frequency doubling is most efficient when "phase-matching" is achieved between a wavelength and its second harmonic. A way to configure a non-linear crystal relates to the way the crystal is "cut" relative to its "crystal axes". These crystal axes are a fundamental property of the type of crystal. The crystal may be manufactured with a "cut" to best provide phase-matching between a selected wavelength and its second harmonic. Fine tuning of this phase-matching may be achieved by "angle-tuning" the medium. The angle tolerance may be less than 0.1 degree, and temperature may be maintained within 0.1 degree. These tolerances vary depending on the nature of the crystal. Alternatively the fine tuning may be is achieved by tuning the nonlinear medium through changes in the temperature thereof.

A laser according to the present invention may alternatively be constructed using a nonlinear Raman crystal (which performs the dual functions of Raman shifting material and nonlinear conversion medium). By eliminating the need for a separate nonlinear medium, the laser resonator cavities can have important benefits of lower resonator losses and shorter resonators. There are two significant potential drawbacks associated with nonlinear-Raman media however: first, thermal loading of the nonlinear/Raman crystal is exacerbated by the additional thermal loading from the Raman conversion process; and second, there is no flexibility to separately optimize the mode sizes in the Raman and the nonlinear crystals (e.g. in a folded or z-type resonator cavity) as may be required for best efficiency. Choice of nonlinear-Raman material is therefore very important—the crystal needs to have good thermal properties as well as a high Raman gain. Typical nonlinear-Raman materials which would be suitable in these arrangements may include KTP, KTA, RTP solid-state crystalline media.

In embodiment particular arrangement, there is provided a scheme for frequency extension of VECSELs which typically operate over one tunable wavelength band. Intracavity SRS enables the generation of a first Stokes wavelength, which can then be converted via intracavity SFG, DFG or SHG to two new visible wavelength bands. These are in addition to the band that can be generated by SHG of the fundamental. The scheme could also be extended to include generation of a second Stokes, and thus an additional two visible bands. The separation of the bands can be managed by selecting a Raman crystal with an appropriate Raman shift. The scheme builds on previous work on wavelength-selectable crystalline Raman lasers [10] in which multi-Watt output powers were demonstrated at 532 nm, 559 nm and 586 nm by intracavity SFG and SHG in a $Nd:GdVO_4$ self-Raman laser.

Compared to crystalline Raman lasers, using a VECSEL to generate tunable fundamental emission enables several tunable bands to be generated, rather than merely several discrete wavelengths. The preferred embodiments demonstrate this scheme using a VECSEL with fundamental beam having a wavelength tunable from about 1040-1076 nm, a KGW crystal which generated a Stokes beam emission having a wavelength tunable between 1148-1192 nm via SRS of the tunable fundamental beam, and a temperature-tuned LBO crystal for SFG, DFG and/or SHG of either (SHG) or both (SFG &DFG) the fundamental and Raman beams. Output in two separate tunable visible bands were achieved, namely 548.5-566 nm for SFG of the fundamental and Stokes wavelengths, and 577.5-596 nm for SHG of Stokes wavelength. SHG of the fundamental beam was not demonstrated here merely due to the high temperature requirement for SHG in the LBO nonlinear material (up to 130-150° C.) which was hard to reach with the available temperature controller. The maximum powers achieved were 0.8 W @560 nm for SFG output and 0.52 W @592.5 nm for SHG output, with optical conversion efficiencies (diode to visible) of 4.2% and 2.9% and slope efficiencies of 5.9% and 4.5% respectively.

The optical arrangement 100 of an example tunable lasing device according to the present invention is shown in FIG. 1. The semiconductor disk (SD) 102 was GaAs based with a strained InGaAs quantum well structure; it produced tunable output over the range 1040-1076 nm. The SD 102 was contacted to a copper mount on one side, and optically-bonded to a piece of planar uncoated diamond heat sink (HS) on the other for heat removal. A 30 W fiber-coupled laser diode 103 at 808 nm ($\Phi$=200 µm, N.A.=0.22) was used to optically pump the SD 102, with imaging optics to produce a pumping spot of about 150 µm radius. A 2.5 mm thick MgF birefringent filter (BF) 109 was placed at Brewster's angle in the fundamental resonator cavity 110 for wavelength selection and tuning of the wavelength of the fundamental beam emitted by the SD 102, and also for control of the linewidth of the fundamental laser beam generated by SD 102. The external resonator 110 for the fundamental beam was formed by the distributed Bragg reflector (DBR) (not shown) integrated into the SD 102 which had high reflectivity (R>99%) at the range of wavelengths of the tunable fundamental beam emitted by the semiconductor device 102—and a concave end mirror (having a radius of curvature of 150 mm) M1 106, with high-reflectivity (R>99.99%) at both fundamental and Stokes wavelengths. Taken in isolation, the SD 102 and external fundamental resonator 110 form a conventional vertical-external-cavity surface-emitting laser (VECSEL) system. The wavelength of the fundamental beam generated by the SD 102 in response to the optical pump light from pump source 103 was centred approximately about 1060 nm with a linewidth of about 1.5 nm and a tuning bandwidth of approximately 40 nm between about 1040 nm to about. 1080 nm. A flat dichroic mirror (DM) 105 was inserted into the fundamental resonator cavity 110 to form a second, coupled Raman resonator cavity 120 bounded by dichroic mirror 105 and end mirror M1 106. Tuning of the fundamental beam generated by the VECSEL is achieved using an optical component in the fundamental resonator cavity 110 which may comprise, for example, one or more birefringent filters (BF) 109 or one or more etalons in the fundamental cavity 110. Alternate tuning mechanisms may also include a prism or grating appropriately inserted into fht fundamental resonator cavity 110 as would be appreciated by the skilled addressee. A solid state Raman active medium, e.g. Raman crystal 107, for example KGW, was located in the Raman resonator cavity 120. The Raman active medium is concurrently located within the fundamental resonator cavity 110 to take advantage of the high intracavity flux density of the fundamental beam and thus for increase efficiency of the Raman conversion process of converting the fundamental beam to A first Stokes beam generated by the Raman active medium 107. The Raman active crystal 107 of the present example arrangement was 25 mm long, and cut for propagation in the $N_g$ and $N_m$ planes. The Raman active crystal 107 (i.e. a solid-state Raman active medium) was placed in the Raman resonator cavity 120 in a rotating mount which enabled rotation of the Raman crystal 107 about its longitudinal axis (i.e. the optical axis of the Raman resonator cavity 120) for optimising the laser output power in output beam 111. The intracavity flat dichroic mirror (DM) 105 was highly transmitting (T>99.5%) at the wavelengths of the fundamental beam and highly reflecting (R>99.9%) at the wavelength of the Stokes beam generated by the Raman-active crystal 107, thereby to form a high Q Raman resonator i.e. having high finesse at the wavelength of the Raman-shifted Stokes beam. A nonlinear crystal 108, for example LBO, was located in both the fundamental resonator 110 and the Raman resonator 120 and, in the present arrangement, was 10 mm long and cut for non-critical phase matching (NCPM). End mirror M1 106 was highly transmitting at the wavelengths obtainable by SHG frequency conversion of with the fundamental beam, SHG frequency conversion of the Stokes beam, and SFG or DFG of both the fundamental and Stokes beams such that the frequency converted beam was output from the laser through end mirror 106 in output beam 111. Since end mirror 106 was highly transmitting at the frequency converted wavelengths, both the fundamental resonator cavity 110 and the Raman resonator cavity 120 were both low-Q or low finesse resonator cavities at the possible wavelengths achieved by frequency conversion of the resonating fundamental and/or Stokes beams. The nonlinear crystal 108 could be temperature-tuned by a tuner (not shown) for selection of either intracavity SFG, intracavity DFG or intracavity SHG according to requirements, and this is the tuning mechanism employed for the present example demonstration. Alternately, the nonlinear medium 108 my be angle tuned as would be appreciated by the skilled addressee. In the present example arrangement, the optimum length of the fundamental resonator cavity 110 was 75 mm in which case the TEM$_{00}$ mode radius for the fundamental beam resonating in fundamental resonator 110 was 150 µm in the SD 102, providing a good match to the pump spot on the SD 102 from pump source 103. The TEM$_{00}$ mode radius was about 180 µm for the fundamental beam resonating in the fundamental resonator 110 and about 150 µm for Stokes generated beam in the Raman active crystal (KGW) 107. The mode sizes of the fundamental and Stokes beams in the nonlinear crystal (LBO) 108 were approximately 200 µm for the fundamental beam and approximately 165 µm for the Stokes beam.

Arrangements of the laser system described herein comprise at least one output coupler adapted to output at least one output beam 111 from the laser system (e.g. end mirror 106 of the previous example arrangement). The output beam 111 generally comprising at least a portion of the frequency converted beam. As would be appreciated, since the wavelength of the fundamental beam is tunable over at least one discreet wavelength/frequency range, then the corresponding wavelength of the Raman-shifted beam generated by Raman active medium 107 is also tunable, and therefore the wavelength of the frequency converted beam, which comprises the output beam 111 of the laser system (which is derived from either or both the fundamental or the Stokes beams depending on the nonlinear frequency conversion method employed—e.g. SHG, SFG or DFG), is also tunable over at least one or more discrete wavelength/frequency ranges. Therefore, the wavelength versatility of the VECSEL laser system is significantly increased whereby a desirable output wavelength can be selected from a plurality of discrete frequency/wavelength ranges.

Typical output coupling methods comprise selection of a resonator mirror having high transmissivity at the wavelength(s) of the tunable frequency converted beam such that the frequency converted beam exits the resonator cavity through the highly transmissive output coupler mirror. Other possible output coupling methods are also envisaged for example, in a particular arrangement comprising a plurality of mirrors forming the resonator cavities, particular output beams 111 having particular wavelengths may be output from the resonator cavity from different resonator mirrors. For example a first one of the resonator mirrors may be highly transmissive for wavelengths in a first frequency converted wavelength range (e.g. visible yellow wavelengths e.g. between about 570 nm to about 590 nm) and when the laser system is configured to generate a frequency converted beam within this first wavelength range (e.g. by SFD of the fundamental beam and the first Stokes shifted beam), the output beam 111 is provided through this first resonator mirror. Additionally a second resonator mirror may be highly transmissive at a second frequency converted wavelength range (e.g. visible green wavelengths e.g. between about 520 nm and about 550 nm) and, when the laser system is configured to generate a frequency converted beam within this second wavelength range (e.g. by SHG of the fundamental laser beam), the output beam 111 is provided through this second resonator mirror. Such a system may have many practical advantages, for example, in an ophthalmic laser system the output beam 111 from each of the two output coupling mirrors may respectively be directed to two separate hand-piece units for different treatment modalities e.g. using either yellow or green laser wavelengths. This arrangement may be particularly suited to a laser system utilising a folded cavity or z-cavity configuration. The Raman resonator cavity 120 of the present example arrangement 100 of the tunable lasing device was a high finesse resonator at the wavelengths of the Raman-shifted beam to promote continuous wave operation of the Raman beam (and hence provide a continuous wave laser output). The Raman resonator 120 was simultaneously a low finesse resonator at the wavelengths of the frequency converted beams (obtained either through SHG, SFG or DFG of the fundamental and/or the Raman beams in the Raman resonator 120). In alternate arrangements, where a pulsed output is desired, the finesse requirements of the Raman resonator (in particular, that component of the finesse—i.e. resonator loss—determined by the reflectivity of the resonator mirrors) may be relaxed as would be appreciated by the skilled addressee in relation to pulsed laser systems.

In further arrangements, the laser system may be designed to generate multiple fundamental beams, i.e. within the full gain bandwidth of the semiconductor chip (as broad as 40 nm in the example case described below), more than one fundamental beam may be generated by the SD simultaneously. The number and the spectral separation of these fundamental lines may be designed by using one or more birefringent filters and/or etalons, and typically the spectral separation will correspond to the free spectral range. The same number of Raman lines may also be generated, and thereby many more frequency converted lines (e.g. in the visible region of the spectrum) can be generated through sum frequency generation of the various pairs. These can be generated "selectably" (as we normally do with a single nonlinear crystal) or more than one visible lines may be generated simultaneously by using more than one nonlinear crystal.

The transmission properties of the dielectric coatings on the cavity reflectors may be optimized to suit the output wavelength(s) of the laser system. Thus for example when the system comprises a non-linear medium for converting the frequency of the laser beam outputting from the Raman-active medium, the reflector may be transmissive for the converted frequency and reflective for all other frequencies generated in the cavity. This may be achieved by selecting the reflectivity of the reflectors which define the cavity such that the cavity is a high optical Q (high finesse) cavity for all wavelengths that are required to resonate therein and not a high Q (i.e. a low Q or low finesse) cavity for wavelengths that are outputted from the resonator cavity. Equivalently, the cavity is a high finesse cavity for all wavelengths that are required to resonate therein and a low finesse cavity for wavelengths that are outputted from the resonator cavity.

The resonator cavity finesse, F, at a particular wavelength is related to the round trip loss, $L_\lambda$ (as discussed above) experienced by a resonating beam in the cavity as it circulates through the resonator cavity and the elements contained therein. The total round trip loss, $L_\lambda$ the resonator at a particular wavelength, 1, can be determined from the equation:

$$F = \frac{\pi\sqrt{1-L_\lambda}}{L_\lambda}.$$

The resonator round trip loss, $L_\lambda$, is wavelength dependent and comprises loss factors due to the mirror transmitivity/loss (or alternatively, the mirror reflectivity) at that wavelength as well as all other losses due to elements within the resonator cavity (i.e. scattering/reflection losses from the elements of the resonator cavity or other round-trip losses as would be appreciated by the skilled addressee) which would be experienced by a beam with wavelength, λ, circulating within the resonator cavity. FIGS. 9A to 9D show examples of the finesse of a resonator cavity as a function of the total round-trip resonator loss, $L_\lambda$ (i.e. including all round-trip resonator losses experienced by a beam circulating within the resonator, and not just losses due to the wavelength dependence of the reflectivities of the resonator mirrors). A high finesse cavity will generally have F greater than about 100 at the particular wavelength of interest. In other arrangements the high finesse may be greater than F=500 or greater than F=1000. A low finesse (low Q) cavity will typically have F less than about 5. The finesse F may be directly related to the cavity optical quality factor (cavity optical Q factor) by the relations:

$$Q = 2\pi \frac{\text{Stored Energy}}{\text{Energy Lost per Cycle}}$$
$$= \frac{\omega_0}{\Delta\omega}$$

and $$F = \frac{\Delta\omega}{\delta\omega}$$
$$= \frac{\omega_0}{\delta\omega}$$
$$= Q \cdot \frac{\Delta\omega}{\omega_0}$$
$$= Q \cdot \frac{T}{t_{RT}}$$
$$= 2\pi \cdot \frac{\text{Stored Energy}}{\text{Energy Lost per Round Trip}}$$

where $\omega_0$ is the resonance frequency of the cavity, δω is the linewidth (FWHM) of the resonance at the cavity resonance frequency, Δω is the free spectral range of the cavity, $T=2\pi/\omega_0$ is the optical cycle time, $t_{RT}=k_o\, 2d/\omega_o=(2\pi n/\lambda_o)(2d/\omega_o)$ is the cavity round trip time, and ko is the wavevector of the travelling wave in the cavity. Note that for the present discussion, the skilled address would be able to discern the wavelength or resonance frequency for use in the above equations when referring to either the fundamental, Raman, or the frequency converted beams as appropriate. Further information on the Q and the finesse of a resonator may be found in a number of texts (such as for example Koechner "Solid State Laser Engineering, $5^{th}$ Ed. Chapters 3 and 5).

Figure 2:
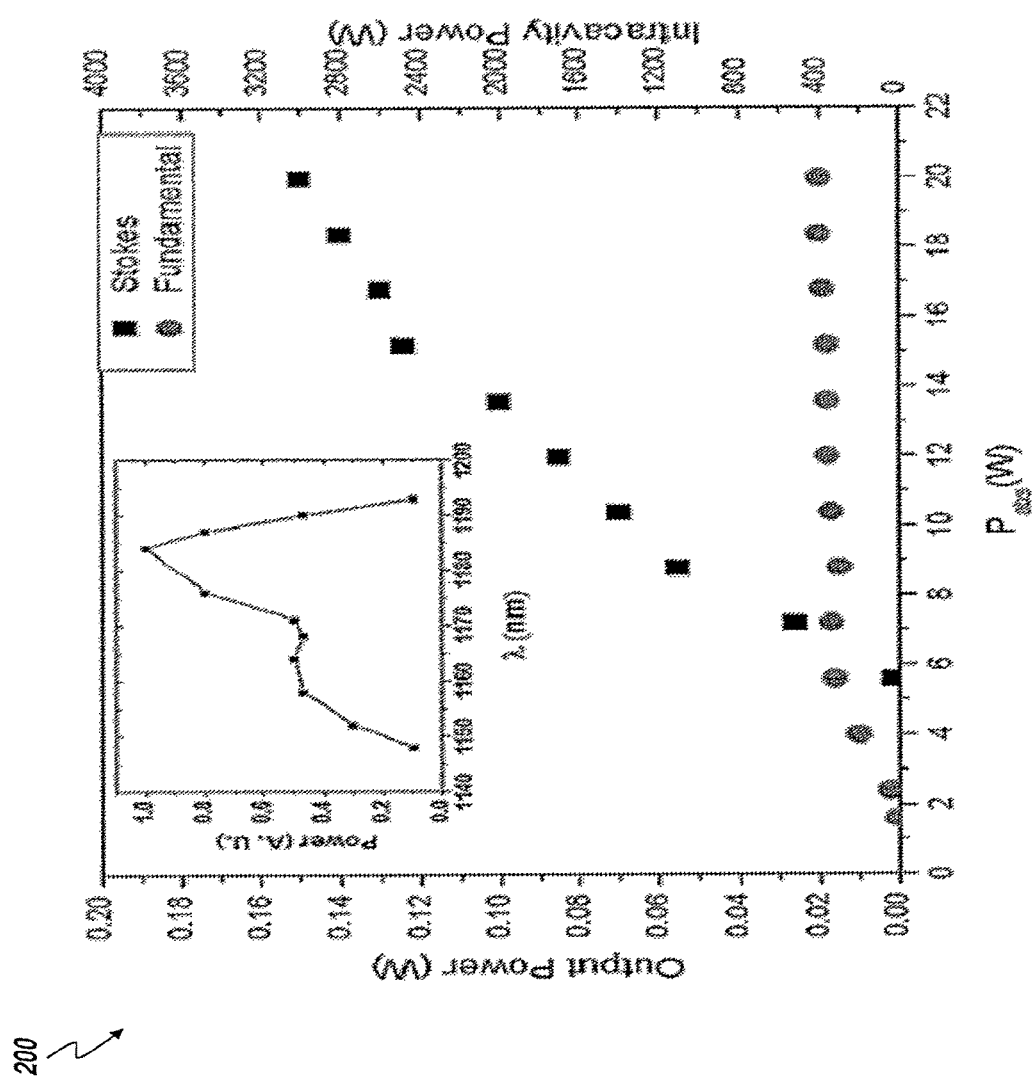
FIG. 2 illustrates the output and intra cavity power of the Stokes and fundamental wavelength versus absorbed pump power, with the insert showing the normalized Stokes output tuning by BF rotation.

Initially, the performance of the Raman laser described herein was characterized without inserting the nonlinear crystal (LBO) 108 into the Raman resonator 120. The Raman active crystal (KGW in the present example) 107 was orientated by rotating the crystal about its longitudinal axis i.e. the optical axis of the resonator cavities 110 and 120 to select the 901 cm$^{-1}$ Raman shift of the KGW crystal and to obtain the highest power at the first-Stokes wavelength. The Stokes wavelength could be tuned from 1148 nm to 1192 nm by rotating the BF 109. The intracavity optical power was estimated by detecting the leaking laser output 111 from M1 106. The highest powers were obtained at a first-Stokes wavelength of about 1184 nm, for which laser performance is shown in FIG. 2. When absorbing 20 W pumped power, the output power vs. wavelength is shown in the inset of FIG. 2. From the transmission of the output coupler M1 106, it is estimated that the maximum output power of 150 mW corresponded to approximately 3000 W of intracavity circulating power at the wavelength of the Stokes beam resonating in the Raman resonator cavity 120. Similarly, it is estimated that the residual fundamental power, which was measured to be clamped at ~20 mW above the SRS threshold, corresponded to ~approximately 400 W of intracavity circulating power at the fundamental wavelength.

Figure 3:
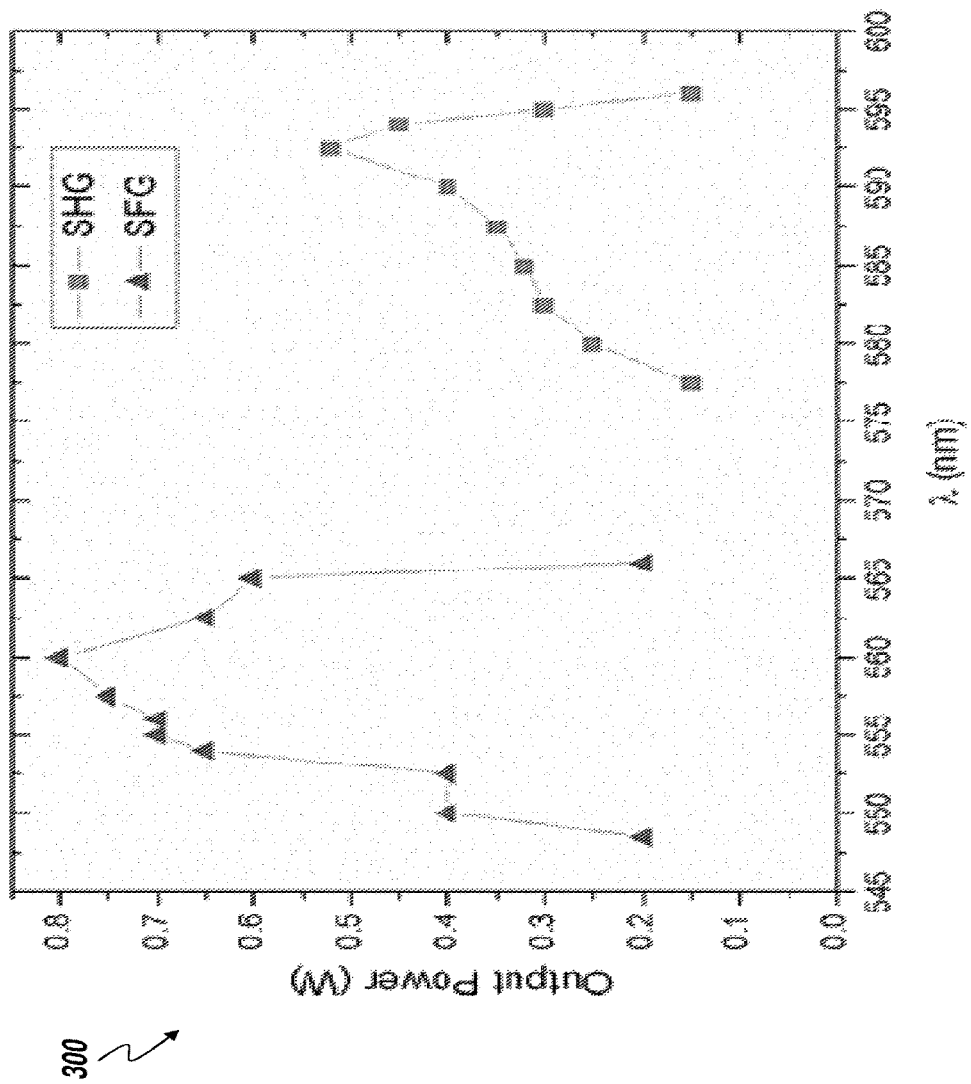
FIG. 3 illustrates the tuning of visible emissions from 577.5-596 nm by SHG and from 548.5-566 nm by SFG.
Figure 4:
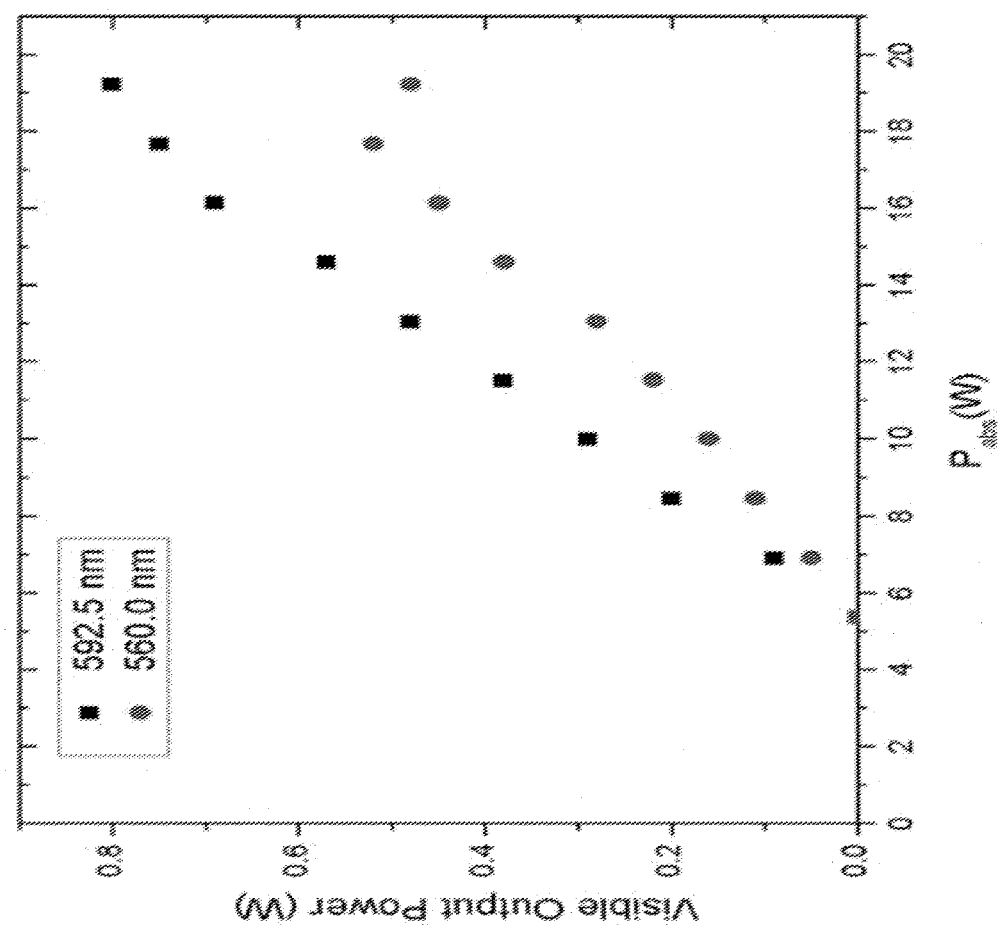
FIG. 4 illustrates a power transfer diagram for 592.5 and 560.0 nm emissions.

When the nonlinear (e.g. LBO) crystal 108 was inserted into the Raman resonator cavity 120, two separate visible emission spectral bands were obtained. The temperature of the nonlinear crystal 108 was tuned to between about 79° C. to about 120° C. for lime frequency converted laser emission from the resonator tunable between about 548.5 and about 566.0 nm. Laser output 111 in this range which was obtained by SFG of the fundamental and Stokes optical fields in the Raman resonator 120. When the nonlinear crystal 109 was tuned to between about 30° C. to about 55° C., yellow-orange frequency converted laser emission from the resonator with a wavelength of between about 577.5 to about 596.0 nm was observed as the result of SHG of the Stokes intracavity field 120. The output power of the frequency converted wavelengths as a function of wavelength is shown in the inset of FIG. 3. The highest output powers occurred at 560 nm for SFG and 592.5 nm for SHG, and the corresponding power transfers are shown in FIG. 4. The threshold for both 560 nm and 592.5 nm corresponded to 5 W of absorbed pump power. For 560 nm, the maximum output power of 0.8 W was obtained for 19.2 W of absorbed pump power, with 5.9% slope efficiency and overall (pump to visible) conversion efficiency of 4.2%. For 592.5 nm, the maximum output power of 0.52 W was achieved for 17.7 W absorbed power, corresponding to 4.5% slope efficiency and an overall (pump to visible) conversion efficiency of 2.9%. Considering that both M1 106 and DM 105 had very high transmission (>80%) from 500-600 nm, the output power could potentially be almost doubled by re-designing the coating of DM 105 to have high reflectivity at the visible frequency converted wavelengths so that the backwards-generated visible emission could be usefully coupled out through mirror M1 106. A similar scheme was previously used successfully for a crystalline solid-state Raman laser as described in [11].

Figure 5:
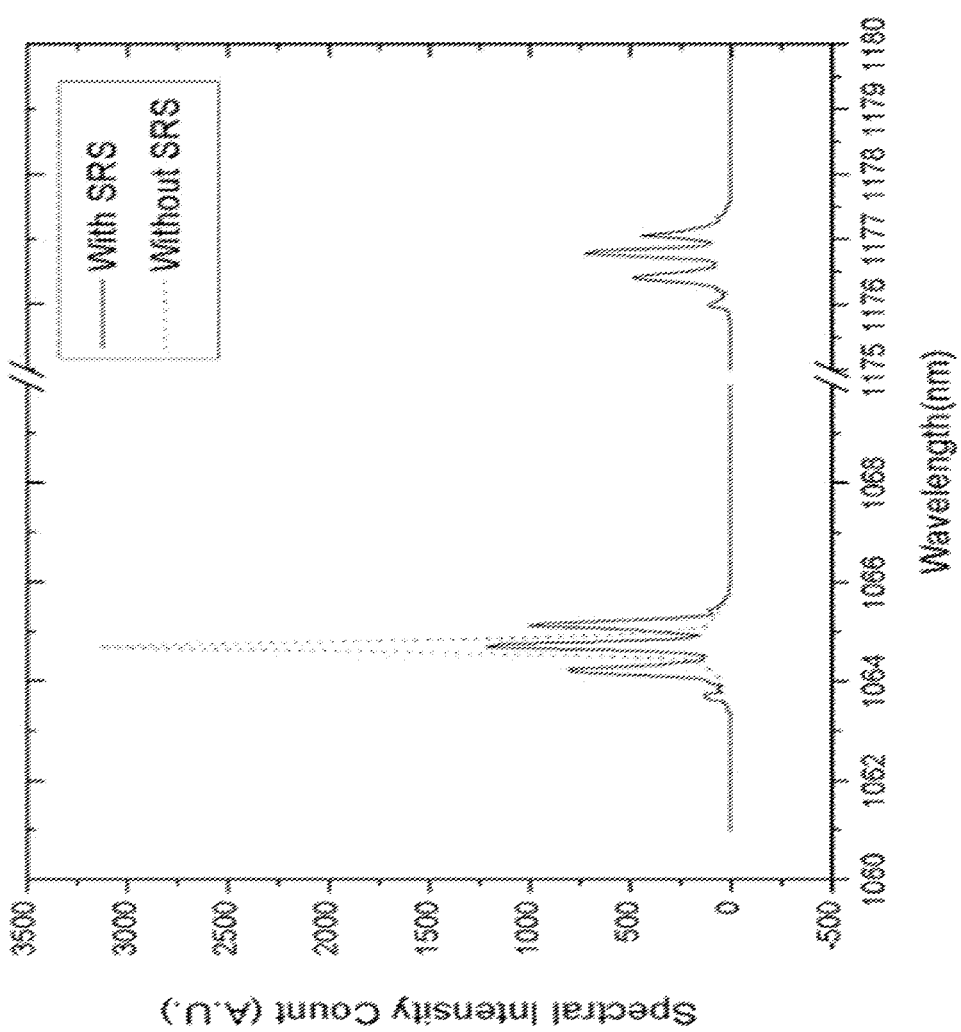
FIG. 5 illustrates an optical spectrum with and without SRS.

The optical spectrum of the output beam 111 from output coupler M1 106 was measured with an optical spectrum analyser (Ocean-optics HR4000, resolution 0.2 nm), and is shown in FIG. 5. The linewidth of fundamental changed dramatically from <0.2 nm without stimulated Raman scattering (SRS) up to ~1.5 nm with SRS. The linewidth of Stokes and visible were about 1 nm and 0.5 nm respectively, containing about three to five modulated peaks caused by the etalon effect in the uncoated diamond heat-spreader. This spectral broadening phenomena has also been observed in an intracavity VECSEL pumped OPO system [7] and SHG systems [12]. The nonlinear process, whether OPO, SHG or SRS, increases the loss for the longitudinal mode selected by the BF 109 and hence results in the weakening of mode selectivity by the BF 109. For both the intracavity OPO [7] and Raman laser, the intracavity power was clamped above the OPO/SRS threshold, which prevented the further depletion of carriers in the SD. Hence, the modes on both sides of the central peak were more likely to surpass the threshold and broaden the spectrum. The broadened spectrum compromised the SRS conversion efficiency because the fundamental power was distributed into more modes rather than being concentrated into one. One strategy for maintaining narrow fundamental linewidth is to insert more polarizers in the fundamental cavity to increase the loss for modes on both sides, as demonstrated in [7].

Figure 6:
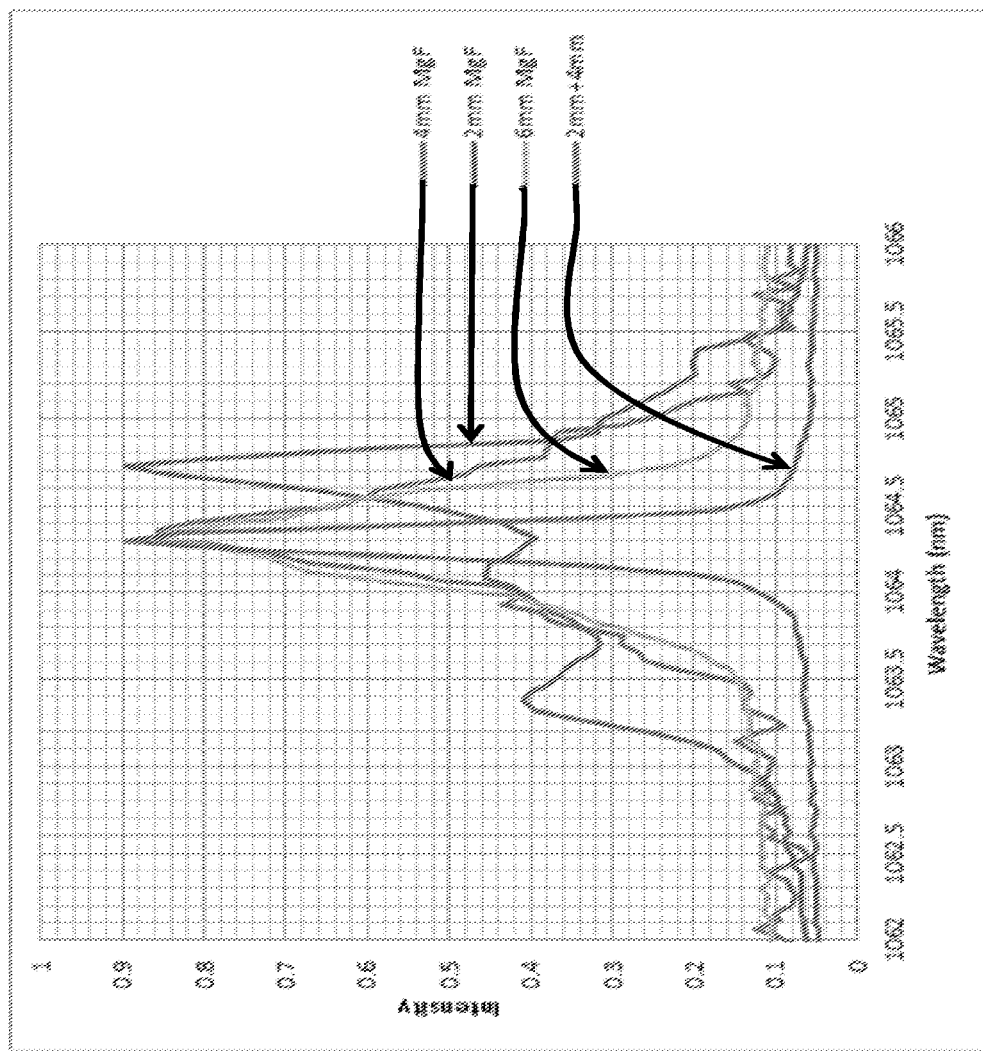
FIG. 6 illustrates the linewidth of the fundamental laser beam generated by the VECSEL laser source when filtered by one or two birefringent filters of varying thickness.
Figure 7:
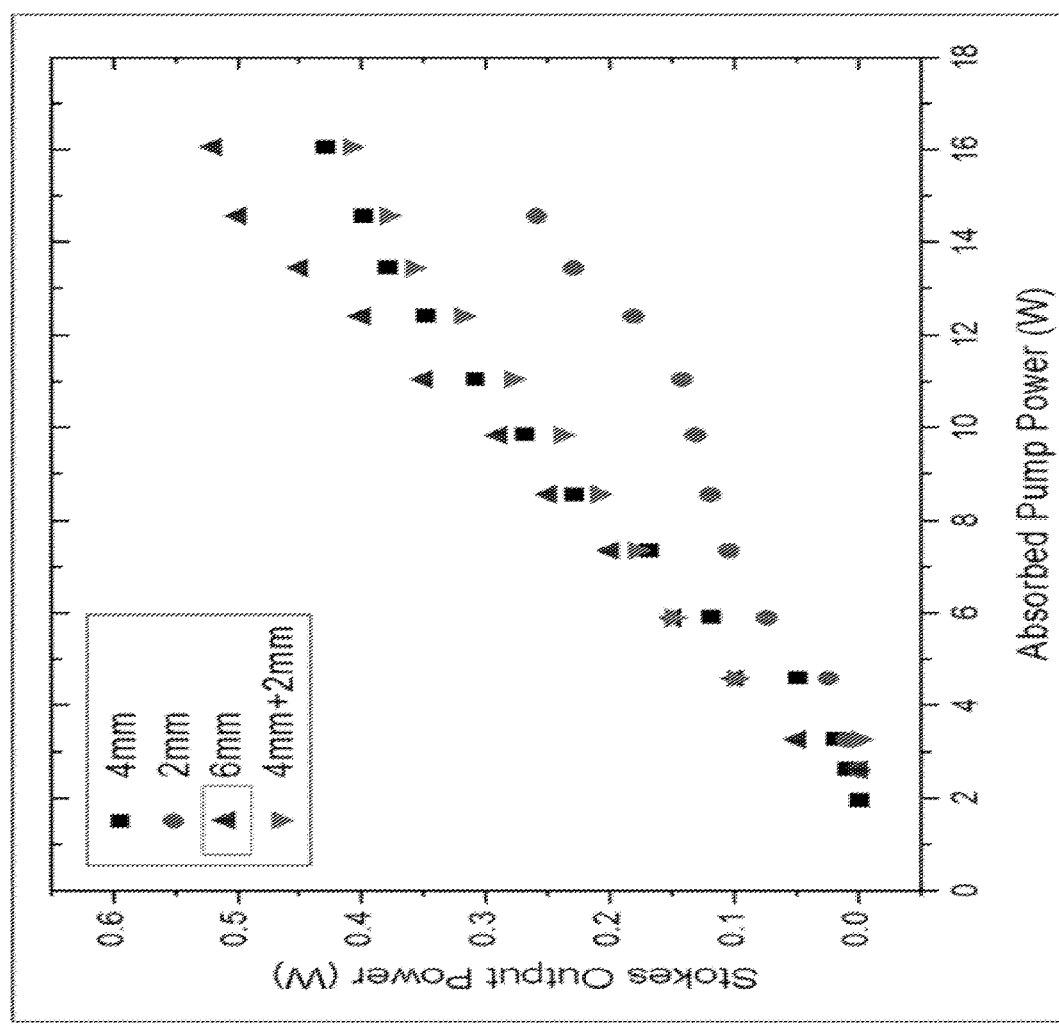
FIG. 7 illustrates the Stokes output power achieved which different configurations of birefringent filters to control the linewidth of the fundamental beam.

To demonstrate the dependence of the efficiency of the laser system on the linewidth of the fundamental beam, linewidth narrowing optical components comprising one or more birefringent filters 109 of varying thickness were inserted into the fundamental resonator cavity 110 (as seen in FIG. 1) and a comparison of the fundamental linewidth and Stokes output power in four experiments using either one or two birefringent filters 109 of varying thickness was examined. In the first three cases a single birefringent filter (BF) was used of different thickness (2 mm, 4 mm, 6 mm), respectively. For the last case two BFs (with thicknesses of 2 mm & 4 mm) were both inserted into the fundamental resonator cavity 110 at the same time. FIG. 6 shows the fundamental linewidth (of the fundamental beam) for each of the four cases, while FIG. 7 shows the Stokes output power in each case. It was found that for the case of a single BF 109 inserted into the fundamental resonator cavity 110, using a thicker BF results in narrower fundamental linewidth and therefore higher Stokes output power. The employment of two BFs can further narrow the fundamental linewidth, but the additional insertion loss from the extra BF compromised the Stokes output power i.e. the second BF resulted in an additional component to the round-trip resonator loss $L_\lambda$ (as discussed above) at the wavelength of the fundamental beam resonating in the fundamental resonator cavity 110 therefore compromising the efficiency of the Raman conversion process of the fundamental beam to the first Stokes Raman shifted beam. With improved design of single or multi-element BF to optimise the free spectral range and finesse, even higher Stokes power can be anticipated.

Another factor that adversely affected the overall conversion efficiency was an insertion loss component to the round-trip resonator loss, $L_\lambda$, at the wavelength of the fundamental beam due to the KGW Raman active crystal 107. An output coupler having transmitivity of T=2.5% at the fundamental wavelength was used to characterize laser performance at the fundamental wavelength, and it was found that inserting the Raman active crystal (KGW) 108 in the Raman cavity 110 led to a 30% drop in output power if the BF 109 was in the coupled fundamental cavity 120. The insertion loss was minimal if the BF 109 was out of the cavity. This suggests that the KGW Raman active crystal 107 was also acting as a waveplate, which in combination with the BF 109 resulted in depolarisation losses for the fundamental beam. In reality, the round-trip loss, $L_\lambda$, is probably only around 1%, however in a high-Q resonator (high finesse resonator), this is significant. The first Stokes field resonating in the Raman resonator cavity 120 did not experience such depolarisation losses since the BF was outside the Raman resonator cavity 120.

In conclusion, there has been demonstrated a scheme for frequency extension of VECSELs. Two separate bands of CW, tunable, visible laser emission have been achieved by intracavity SFG/SHG of a VECSEL-pumped intracavity KGW Raman laser. A 17.5 nm tuning range and maximum output power of 0. about 8 W at about 560 nm (in the lime region of the visible spectrum), and a 18.5 nm tuning range and maximum output power of about 0.52 W at about 592.5 nm (in yellow-orange region of the visible spectrum) has been achieved, considerably expanding the spectral coverage of a single VECSEL device. In the future, improved linewidth control, the use of an intracavity visible reflector and selection of suitable Raman-active media to avoid depolarisation losses should result in higher conversion efficiencies, similar to those (10-20%) achieved for crystalline Raman lasers [10]. Also, since SRS is a cascading process, broader mirror coatings should also enable the Second-Stokes wavelength to be generated by the Raman active medium 107 and resonated in the Raman resonator cavity 120 [13], which can then be frequency converted by a nonlinear medium 108 by either SHG, SFG, DFG or other suitable nonlinear frequency conversion process, thereby extending the spectral coverage of the VECSEL laser system even further.

Figure 8A:
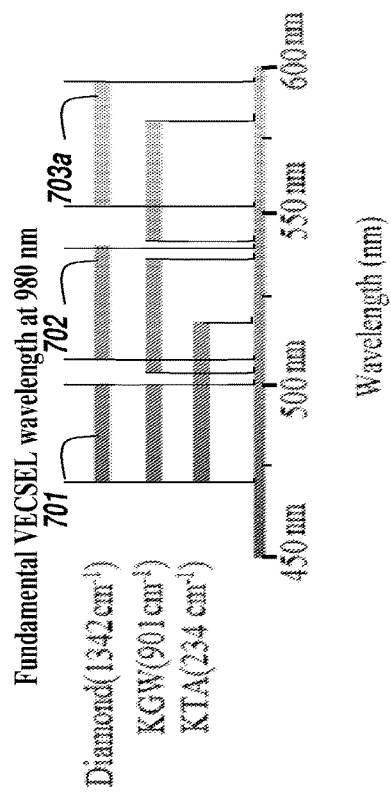
FIGS. 8A and B illustrate the range of visible output wavelengths obtainable from the Raman laser of FIG. 1 with a tunable VECSEL fundamental wavelengths of 980 nm (FIG. 8A) and 1060 nm (FIG. 8B).
Figure 8B:
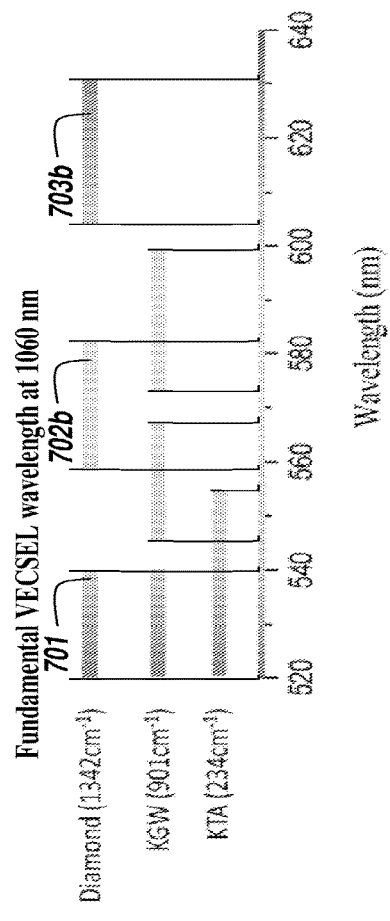
Figure 9A:
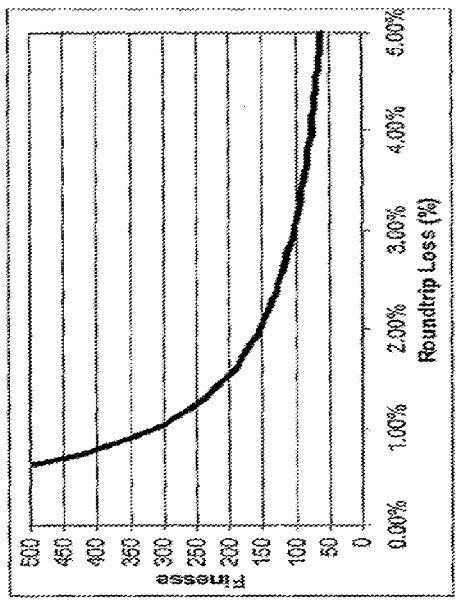
FIGS. 9A to 9D are graphs showing the resonator finesse as a function of roundtrip resonator losses.
Figure 9C:
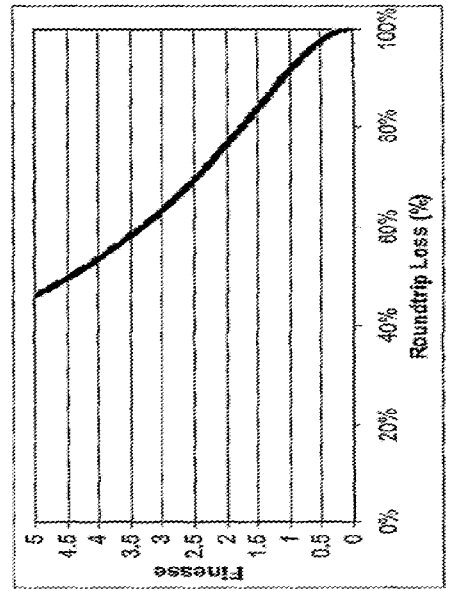
Figure 9B:
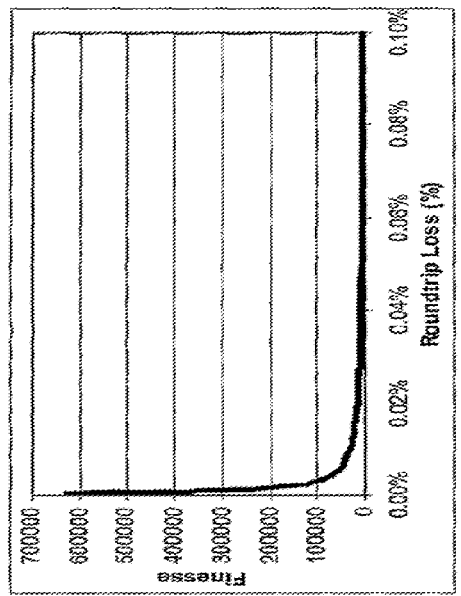
Figure 9D:
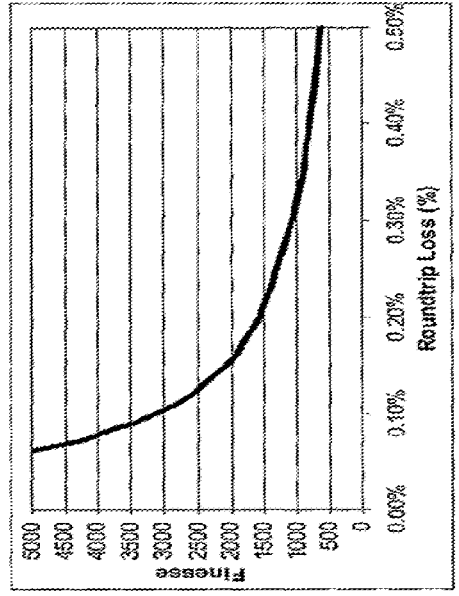

A number of modifications of the preferred embodiment are possible. For example, other types of semiconductor materials can be used to choose the (tunable) fundamental wavelength range. Further, improved results may be obtained by narrowing down the linewidth of fundamental to enhance the conversion process of the fundamental beam to the Raman shifted first-Stokes beam. For example, through utilization of customised birefringent filters (tailoring the number of plates, and the refractive index and thickness of the plate(s)). Further improvements can also be obtained by inserting more optical components such as additional polarizers or etalons into the resonator cavities for increased mode-selection discrimination Single-longitudinal mode operation can be achievable. Further, more than one semiconductor chip can be used within one laser cavity for power scaling to achieve greater output powers. A range of other power scaling mechanisms are known in the art which can be applied to the laser systems & devices described herein as would be appreciated by the skilled addressee. Further, rather than selection of KGW as the Raman active medium 107, the Raman active medium used can by interchanged with a selection of a wide range of alternate solid state Raman media which can be used to generate different wavelengths based on the characteristic Raman-shift of the selected medium. Alternate solid state Raman active media may include, for example, $Ba(NO_3)_2$, $Ba(WO_4)$, diamond, various vanadates, tungstates, molybdates, lithium iodate, lithium niobate etc. Choosing a Raman crystal with a large characteristic Raman shift enables tunable operation within two or more well-separated bands. By choosing a Raman crystal with a small characteristic Raman shift, the tunable bands can be stacked together so they tend to overlap slightly and in this way, continuously tunable operation over a wider wavelength range can be achieved. An example of this is the tuning range of in the visible wavelength region when a KTA Raman-active material (having a characteristic Stokes shift of 234 $cm^{-1}$) is selected as can be seen in FIGS. 8A and 8B. For example, starting with a fundamental beam having a wavelength of 980 nm (FIG. 8A) the output visible frequency converted light 111 can be continuously turned over a range of between about 470 and about 520 nm through the combination of SHG of either the fundamental beam or the Stokes-sifted beam or sum-frequency generation between the fundamental and Stokes beams in the cavity i.e. the available frequency converted wavelengths obtainable through either SHG of the fundamental or Stokes beams or SFG of both fundamental and Stokes beams each overlap thereby providing a continuous tuning range of possible output wavelengths. In FIG. 8B it is seen that, for a fundamental wavelength of 1060 nm, the tuning range available in the visible region of the spectrum ranges between about 520 nm and about 550 nm using SFG or SHG of the beams in the Raman resonator cavity 120.

FIGS. 8A and 8B also show the expected visible output ranges that could be obtained using the VECSEL Raman laser system disclosed herein with selection of either Diamond (with a characteristic Raman shift of 1342 $cm^{-1}$) and KGW (with a characteristic Raman shift of 901 $cm^{-1}$) Raman-active materials combined with a fundamental beam (generated by suitable selection of a VECSEL SD 102) having a wavelength of 980 nm (FIG. 8A) and 1060 nm (FIG. 8B) respectively. In these two Figures, the first band (e.g. bands 701a and 701b using diamond as the selected Raman-active medium) shows the possible frequency converted output wavelengths obtained by SHG of the tunable fundamental beam, the second band (e.g. bands 702a and 702b using diamond as the selected Raman-active medium) shows the possible frequency converted out wavelengths obtained by SFG of the fundamental beam and the First Stokes beam generated by the Raman active material, and the third band (e.g. bands 703a and 703b using diamond as the selected Raman-active medium) shows the possible frequency converted output wavelengths obtained by SHG of the First Stokes beam generated by the Raman active material derived from the tunable fundamental beam.

Additionally, different resonator cavity configurations may be utilised as opposed to the simple linear resonate cavity arrangement shown in FIG. 1. For example. For example z-cavity arrangements may be used which enable finer control of the resonator mode sizes for improved mode-matching of the relevant beams resonating in and/or generated in the resonator cavity for improved conversion efficiency as would be appreciated by the skilled addressee.

For some Raman crystals which have more than one Raman shift peak on the spontaneous Raman scattering spectrum (eg. LiIO3 which has characteristic Raman shifts of 822 $cm^{-1}$ and 770 $cm^{-1}$), different Raman shifts can be chosen by, for example, controlling the coating parameters of the resonator cavity mirrors. For some Raman crystals which have different Raman shifts along different orientations, the different Raman shifts can be chosen simply by changing the orientation of the Raman crystal with respect to the optical axis of the resonator cavity, for example by rotating the Raman-active crystal about its longitudinal-axis (i.e. the optical axis of the resonator cavity). Further, the Raman resonator cavity 120 can be designed so that the mode matching between fundamental beam and the Raman-shifted Stokes beams inside the Raman crystal 107 is more accurate. Further, the Raman resonator cavity 120 could be designed to resonate both the first, second, and/or potentially higher Stokes orders. For each additional Stokes order, additional tunable visible bands output from the laser device 100 can be realised (i.e. by selection of either SFG or SHG of the beams within the Raman resonator cavity 120).

Intracavity second-harmonic-generation or sum-frequency-generation can be provided by selection from many different nonlinear crystals—BBO, LBO, BiBO, KTP, KTA, LNB, LiIO3. Periodically-poled materials can be used. Bulk or waveguide geometries can also be used. Further, either angle-tuning or temperature-tuning can be adopted for wavelength switching. Fanned periodically-poled materials can be used. Additionally, multiple nonlinear crystals can be used—for example, two (or more nonlinear media 108 may be inserted into the Raman resonator cavity 120 and each may be tuned independently for nonlinear frequency conversion of a selection of the beams within the Raman resonator cavity 120. Crystals that are both Raman active and useful for SHG/SFG can be used—e.g. KTA, KTP, LNB, LiIO3.

Currently the collection efficiency of the generated SHG/SFG beam in the constructed prototype described above is about 50%. By using an additional dichroic mirror or redesigning the coating for current dichroic mirrors used in the above described example arrangement (e.g. dichroic mirror 105 could be modified to simultaneously be highly reflecting at the wavelengths of the frequency converted beams), the backward propagating (i.e. propagating towards the SD 102 and away from end mirror 106) visible emissions can be reflected towards the output coupler (end mirror 106, in the present example) to increase the output power of the frequency converted output beam 111 from the laser system 100.

The teachings of the preferred embodiment may also be applied to VECSEL lasers which are modulated externally or intracavity. This includes Q-switched and mode-locked VECSEL lasers which may be utilised to provide a pulsed frequency-converted output beam 111.

It will be appreciated that the methods/apparatus/devices/systems described/illustrated above at least substantially provide a tunable Raman laser providing output in the visible region of the optical spectrum The laser arrangements, devices, systems, and methods described herein, and/or shown in the drawings, are presented by way of example only and are not limiting as to the scope of the invention. Unless otherwise specifically stated, individual aspects and components of the laser arrangements, devices, systems, and methods may be modified, or may have been substituted therefore known equivalents, or as yet unknown substitutes such as may be developed in the future or such as may be found to be acceptable substitutes in the future. The laser arrangements, devices, systems, and methods may also be modified for a variety of applications while remaining within the scope and spirit of the claimed invention, since the range of potential applications is great, and since it is intended that the present laser arrangements, devices, systems, and methods be adaptable to many such variations.

REFERENCES

1. M. Kuznetov, Semiconductor Disk Lasers: Physics and Technology. Wiley Online Library. Chap. 1 (2010).
2. S. H. Park, J. Kim, et al., Appl. Phys. Lett., 83, 2121 (2003).
3. N. Schulz, B. Rosener, R. Moser, M. Rattunde, C. Manz, K Kohler, and J. Wagner, Appl. Phys. Lett., 93, 181113 (2008).
4. J. Chilla, Q. Z. Shu, H. Zhou, E. Weiss, M. Reed, and L. Spinelli, Proc. SPIE, 6451, 645109 (2007).
5. M. Fallahi, F. Li, et al., Photon. Tech. Lett., 20 1700 (2008).
6. T. Baer, J. Opt. Soc. Am. B, 3, 1175 (1986).
7. D. J. M. Stothard, J-M. Hopkins, D. Burns and M. H. Dunn, Opt. Exp., 17, 10648 (2009).
8. Hoffmann, and M. R. Hofmann, Laser Photon. Rev., 1, 44 (2007).
9. D. C. Parrotta, W. Lubeigt, A. J. Kemp, D. Burns, M. D. Dawson, and J. E. Hastie, Opt. Lett., 36, 1083 (2011).
10. A. J. Lee, D. J. Spence, J. A. Piper, and H. M. Pask, Opt. Exp., 18, 20013 (2010).
11. A. J. Lee, H. M. Pask, P. Dekker, and J. A Piper, Opt. Exp., 16, 21958 (2008).
12. T. D. Raymond, W. J. Alford, M. H. Crawford, and A. A. Allerman, Opt. Lett., 24, 1127 (1999).
13. A. J. Lee, J. Lin, H. M. Pask, Opt. Lett., 35, 3000 (2010).

INTERPRETATION

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein. For the purposes of the present invention, additional terms are defined below.

The terminology used herein is for the purpose of describing particular embodiments only and is not intended to be limiting of the invention. As used herein, the singular articles "a", "an" and "the" are intended to include the plural forms as well, unless the context clearly indicates otherwise and thus are used herein to refer to one or to more than one (i.e. to at least one) of the grammatical object of the article. By way of example, "an element" refers to one element or more than one element.

The term "about" is used herein to refer to quantities that vary by as much as 30%, preferably by as much as 20%, and more preferably by as much as 10% to a reference quantity.

Throughout this specification, unless the context requires otherwise, the words "comprise", "comprises" and "comprising" will be understood to imply the inclusion of a stated step or element or group of steps or elements but not the exclusion of any other step or element or group of steps or elements.

The following description and figures make use of reference numerals to assist the addressee understand the structure and function of the embodiments. Like reference numerals are used in different embodiments to designate features having the same or similar function and/or structure.

The drawings need to be viewed as a whole and together with the associated text in this specification. In particular, some of the drawings selectively omit including all features in all instances to provide greater clarity about the specific features being described. While this is done to assist the reader, it should not be taken that those features are not disclosed or are not required for the operation of the relevant embodiment.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the above description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

References throughout the specification to a 'fundamental' wavelength, a 'fundamental' beam, 'a 'fundamental' emission and the like refer to a laser beam generated by a lasing device having a wavelength capable of being frequency converted by one or more elements of the laser system(s) disclosed herein, for example, the fundamental beam may be frequency converted by Raman shifting in a Raman-active medium (typically by a stimulated Raman scattering (SRS) process whereby the fundamental beam is typically 'down-converted' or shifted to a laser beam having a longer wavelength/lower frequency). A Raman-shifted beam as discussed in the present specification refers to a fundamental beam after being frequency converted by a SRS process and, where a single Raman shift has occurred, the Raman shifted beam is referred to as a first Stokes beam, or more generally, simply a 'Stokes' beam having a first Stokes (or simply 'Stokes') wavelength whereby a' Stokes' Raman process refers to down-conversion of a fundamental beam to a longer wavelength/lower frequency as opposed to the rarer and, in practice, more difficult, Anti-Stokes SRS process of up-converting a fundamental beam to an Anti-Stokes beam having a shorter wavelength/higher frequency than the fundamental beam. As would be appreciated by the skilled addressee, the first stokes beam may in turn be Raman shifted in the same Raman active medium and by the same SRS process to generate a second Stokes beam. Similarly higher-order Stokes beams may also be generated in the same manner. Alternatively the 'fundamental' beam may be 'up-converted' or shifted to a shorter wavelength/higher frequency by a nonlinear process in a nonlinear medium for example by second harmonic generation (SHG), third harmonic generation (THG), sum frequency mixing (SFG), difference frequency mixing (DFG) or the like.

Furthermore, while some embodiments described herein include some but not other features included in other embodiments, combinations of features of different embodiments are meant to be within the scope of the invention, and form different embodiments, as would be understood by those skilled in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Similarly, it is to be noticed that the term coupled, when used in the claims, should not be interpreted as being limited to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

The invention claimed is:

1. A tunable lasing device comprising:
a vertical external cavity surface emitting laser (VECSEL), adapted to generate a fundamental laser beam in response to pumping from a pump source, said fundamental laser beam having a fundamental wavelength and a fundamental linewidth; said lasing device comprising:
   a fundamental resonator cavity defined by at least first and second reflective elements and adapted to resonate the fundamental beam therein;
   a first optical element comprising one or more birefringent filters and/or one or more etalons located within the fundamental resonator cavity to control the width of the fundamental linewidth of the fundamental beam;
   a Raman resonator cavity located at least partially in said fundamental resonator cavity and coupled therewith, the Raman resonator cavity being defined by at least two reflective elements, wherein at least one of the reflective elements is different from the first and second reflective elements and wherein the first optical element is separate from the Raman resonator cavity, the Raman resonator cavity adapted to receive the fundamental beam and generate an output beam, the Raman resonator cavity comprising therein:
      a solid state Raman active medium located in said Raman resonator cavity for generating at least a first Stokes beam from the fundamental beam wherein said Raman resonator cavity is adapted to resonate said Stokes beam therein and produce a continuous wave beam; and
      a nonlinear medium located in said Raman resonator cavity for nonlinear frequency conversion of at least one of the beams present in said Raman resonator cavity thereby generating at least one continuous wave frequency converted beam;
   wherein one of said reflective elements is an output coupler that is transmissive at two or more predefined wavelength ranges corresponding to the wavelengths of said output beam, wherein the predefined wavelength ranges partially overlap so that said output beam is continuously tunable over a combined range of the predefined wavelength ranges, said output beam comprising at least a portion of said frequency converted beam derived from at least one of the resonating beams in said fundamental or said Raman resonator cavities; and wherein said output beam is continuously tunable within the two or more predefined wavelength ranges by selective adjustment of one or both of the nonlinear medium or first optical element.

2. A tunable lasing device as claimed in claim 1 wherein said fundamental resonator cavity comprises said external cavity of said vertical external cavity surface emitting laser.

3. A tunable lasing device as claimed in claim 1 wherein the first optical element is additionally adapted for tuning the wavelength of the fundamental beam.

4. A tunable lasing device as claimed in claim 1 wherein said Raman active medium is selected from the group comprising: a Potassium Gadolinium Tungstate (KGW) crystal; a Barium tungstate (Ba W04) crystal; diamond, Lithium niobate (LiNb03) crystal, either bulk LiNb03 crystal or periodically-poled LiNb03, a KTA crystal and a KTP crystal, wherein said nonlinear medium is selected from the group comprising LBO, BiBO, BBO, KTP, bulk LiNb03 and periodically-poled LiNb03.

5. A tunable lasing device as claimed in claim 1 wherein the tunable lasing device is adapted to generate an output beam having a wavelength selectable from the group comprising: a wavelength in the blue region of the spectrum; a wavelength in the green region of the spectrum; and a wavelength in the yellow region of the spectrum.

6. A tunable lasing device as claimed in claim 1 wherein the tunable lasing device is adapted to generate an output beam having a wavelength selectable from the group comprising: a wavelength in the green region of the spectrum; a wavelength in the yellow region of the spectrum; and a wavelength in the red region of the spectrum.

7. A tunable lasing device as claimed in claim 1 wherein the tunable lasing device is adapted to generate an output beam having a wavelength selectable from the group comprising: a wavelength in the blue region of the spectrum; and a wavelength in the green region of the spectrum.

8. A tunable lasing device as claimed in claim 1 wherein the tunable lasing device is adapted to generate an output beam having a wavelength selectable from the group comprising: a wavelength in the green region of the spectrum; and a wavelength in the yellow region of the spectrum.

9. A tunable lasing device as claimed in claim 1 comprising intra cavity nonlinear mixing and wherein said output coupler is adapted for outputting said output beam having two separate tunable emission bands.

10. A tunable lasing device as claimed in claim 9 wherein said output beam comprises a first tunable emission band generated by sum frequency generation and a second tunable emission band is generated by second harmonic generation.

11. A tunable lasing device as claimed in claim 1 wherein said output beam is tunable through either temperature tuning or angle tuning of an intracavity solid state nonlinear medium.

12. A tunable lasing device according to claim 1 wherein the first optical element includes a birefringent filter having a thickness of 6 mm.

13. A tunable lasing device according to claim 1 wherein the first optical element includes two birefringent filters.

14. A tumble lasing device according to claim 1, wherein the first optical element is configured to control the width of the fundamental linewidth of the fundamental beam.

15. A tunable lasing device as claimed in claim 1 wherein the number of predefined wavelength ranges is at least three.

16. A tunable lasing device as claimed in claim 1 wherein the combined range of the predefined wavelength ranges is in the visible spectrum.

\* \* \* \* \*